United States Patent
Rodmacq et al.

(10) Patent No.: US 8,247,093 B2
(45) Date of Patent: Aug. 21, 2012

(54) MAGNETIC MULTILAYER DEVICE, METHOD FOR PRODUCING SUCH A DEVICE, MAGNETIC FIELD SENSOR, MAGNETIC MEMORY AND LOGIC GATE USING SUCH A DEVICE

(75) Inventors: Bernard Rodmacq, Veurey Voroize (FR); Stéphane Auffret, Vaulnaveys le Haut (FR); Bernard Dieny, Lans en Vercors (FR); Jérôme Moritz, Saint Pierre de Bressieux (FR)

(73) Assignees: Commissariat a l'Energie Atomique, Paris (FR); Centre National de la Recherche Scientifique, Paris (FR)

( * ) Notice: Subject to any disclaimer, the term of this patent is extended or adjusted under 35 U.S.C. 154(b) by 190 days.

(21) Appl. No.: 11/959,816

(22) Filed: Dec. 19, 2007

(65) Prior Publication Data
US 2008/0151615 A1 Jun. 26, 2008

Related U.S. Application Data (60) Provisional application No. 60/891,752, filed on Feb. 27, 2007.

(30) Foreign Application Priority Data

Dec. 26, 2006 (FR) ...................... 06 55943

(51) Int. Cl.
*G11B 5/33* (2006.01)
(52) U.S. Cl. ..................... 428/812; 365/173
(58) Field of Classification Search .......... 365/173; 335/302; 204/192.15; 428/827–829
See application file for complete search history.

(56) References Cited

FOREIGN PATENT DOCUMENTS
EP 1 612 775 1/2006

OTHER PUBLICATIONS

B. Rodmacq et al., Crossovers from in-plane to perpendicular anisotropy in magnetic tunnel junctions as a function of the barrier degree of oxidation), May 2003, Journal of Applied Physics, vol. 93, No. 10, 7513-7515.*
A.B. Pakhomov et al., "Giant Hall effect in percolating ferromagnetic granular metal-insulator films". Appl. Phys. Lett. 67 (23), Dec. 4, 1995, pp. 3497-3499.
B. Dieny et al., "Spin-dependent tunneling in discontinuous metal/insulator multilayers". Journal of Magnetism and Magnetic Materials 185 (1998), pp. 283-292.
C. Christides et al., "Polarity of anomalous Hall effect hysteresis loops in [Pt/Co]$_{15}$/AF[Co/Pt]$_{15}$ (AF=FeMn, NiO) multilayers with perpendicular anisotropy". Journal of Applied Physics 97, 013901 (2005).
Ch. Morawe et al., "Structure and thermal stability of sputtered metal/oxide multilayers: The case of Co/Al$_2$O$_3$" J. Appl. Phys. 77 (5); Mar. 1, 1995, pp. 1969-1976.

(Continued)

Primary Examiner — Holly Rickman
Assistant Examiner — Linda Chau
(74) Attorney, Agent, or Firm — Burr & Brown (57) ABSTRACT

This magnetic multilayer device comprises, on a substrate, an alternating sequence of magnetic metallic layers M and oxide, hydride or nitride layers O. The number of layers M equals at least two. The layers M are continuous. There is interfacial magnetic anisotropy perpendicular to the plane of the layers at the level of the M/O interfaces.

22 Claims, 6 Drawing Sheets

OTHER PUBLICATIONS

G.S.D. Beach et al., "Co-Fe Metal/Native-Oxide Multilayers: A New Direction in Soft Magnetic Thin Film Design I. Quasi-Static Properties and Dynamic Response". IEEE Transactions on Magnetics, vol. 41, No. 6, Jun. 2005, pp. 2043-2052.

G.S.D. Beach et al., "Co-Fe Metal/Native-Oxide Multilayers: A New Direction in Soft Magnetic Thin Film Design II. Microscopic Characteristics and Interactions". IEEE Transactions on Magnetics, vol. 41, No. 6, Jun. 2005, pp. 2053-2063.

G.X. Miao et al., "Giant Hall resistance in Pt-based ferromagnetic alloys". Applied Physics Letters, vol. 85, No. 1, Jul. 5, 2004, pp. 73-75.

F. Garcia et al., "Exchange-biased spin valves with perpendicular magnetic anisotropy based on (Co/Pt) multilayers", Journal of Applied Physics, vol. 93, No. 10, May 15, 2003, pp. 8397-8399.

T. Nawrath et al., "Magnetic anisotropies and magnetotransport in $CeH_2$/Co multilayers". vol. 55, No. 5, Feb. 1, 1997, pp. 3071-3082.

O. Riss et al., "Reorientation phase transition and sensitivity of the extraordinary Hall-effect-based sensors". Journal of Magnetism and Magnetic Materials 298 (2006), pp. 73-77.

T.W. Kim et al., "Spontaneous Hall effect in amorphous Tb-Fe and Sm-Fe thin films". Journal of Applied Physics, vol. 89, No. 11, Jun. 1, 2001, pp. 7212-7214.

* cited by examiner

MAGNETIC MULTILAYER DEVICE, METHOD FOR PRODUCING SUCH A DEVICE, MAGNETIC FIELD SENSOR, MAGNETIC MEMORY AND LOGIC GATE USING SUCH A DEVICE

FIELD OF THE INVENTION

The present invention relates to the field of magnetic materials, more especially those intended to be used firstly as magnetic field sensors or in non-volatile magnetic random-access memories used to store and read data in electronic systems or even to produce components that can be used in the field of reprogrammable logic devices.

DESCRIPTION OF THE PRIOR ART

One of the applications to which the present invention relates concerns magnetic devices that are used to detect magnetic fields on the basis of measuring the extraordinary Hall effect.

There are two types of Hall effect: the ordinary Hall effect and the extraordinary Hall effect. The ordinary Hall effect occurs in metallic materials or doped semiconductors and is due to the Lorentz force that acts on electrons under the influence of a magnetic field. The extraordinary Hall effect occurs to a limited extent in ferromagnetic materials and is the result of diffusion of electrons due to spin-orbit interaction with the magnetic moments of the ferromagnetic material.

Figure 1:
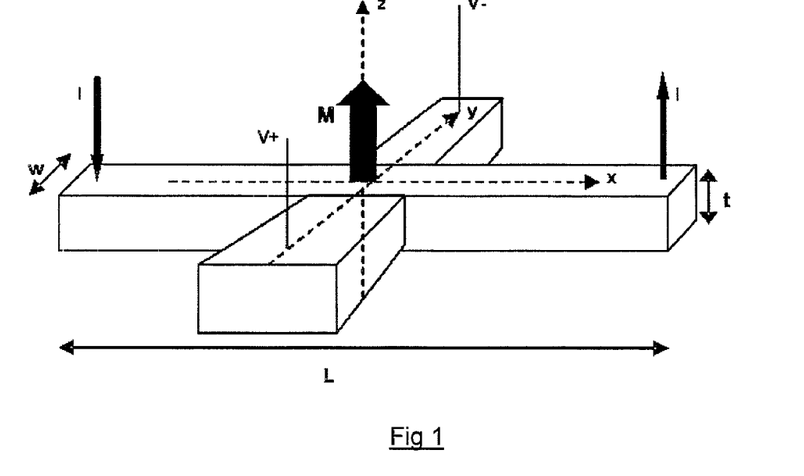
FIG. 1 is a schematic view of a typical method of measuring the extraordinary Hall effect of a magnetic sample.

FIG. 1 is a view of, among other things, one geometry for measuring the Hall effect. It schematically shows a cross made of a ferromagnetic material of length L (along the x-axis), width w (along the y-axis) and thickness t (along the z-axis) through which current I flows along the x-axis and which is subjected to a magnetic field H that is perpendicular to plane (x, y). Due to the effect of the Lorentz force resulting from the applied magnetic field and spin-orbit interactions that couple the electron paths with the local magnetization of the material, the current flow lines curve in a direction that is transverse to the direction of the current and a voltage, referred to as the "Hall voltage", then appears in order to re-establish equilibrium. This voltage is measured perpendicular to the direction of the current, i.e. in direction y.

One characteristic parameter of the Hall effect is the Hall resistivity which is given by the following equation:

$$\rho_{xy}=(V_{xy}/I)t=R_0H+4\pi R_sM_z \quad (1)$$

where:
$V_{xy}$ is the Hall voltage measured in-plane (L, w) in a direction perpendicular to that of the electric current,
I is the intensity of the injected current,
t is the thickness of the thin film,
$R_0$ is the ordinary Hall coefficient,
H is the amplitude of the applied magnetic field,
$R_s$ is the extraordinary Hall coefficient and $M_z$ is the perpendicular component of the magnetization of the thin film.

In addition, current I flowing in the thin film generates a longitudinal voltage according to the following equation:

$$V_{xx}=RI \quad (2)$$

where $R=\rho_{xx}L/(wt)$ is the resistance of the material and $\rho_{xx}$ is its longitudinal electrical resistivity (parallel to the direction of current I). Combining equations (1) and (2) gives:

$$V_{xy}/V_{xx}=(w/L)\rho_{xy}/\rho_{xx} \quad (3)$$

where $\rho_{xy}/\rho_{xx}$ is a dimensionless parameter called the Hall angle that characterizes the ability of the material to deviate the electron flux relative to the direction of the longitudinal electric field. Its value is of the order of several percent for common magnetic materials. w/L is a geometric factor that can be of the order of 1 at most.

The first term of equation (1), $R_0H$, corresponds to the ordinary Hall resistivity and the second term, $4\pi R_sM_z$, corresponds to the extraordinary Hall resistivity. For relatively weak magnetic fields, the ordinary Hall effect is generally several orders of magnitude smaller than the extraordinary Hall effect and can therefore be ignored.

If the magnetization of the ferromagnetic layer is parallel to the plane, which is generally the case for thin films, its perpendicular component $M_z$ increases linearly with the applied magnetic field until saturation magnetization $M_s$ is reached. Therefore, as long as $M_z$ is less than $M_s$, the extraordinary Hall voltage is proportional to the applied magnetic field.

Figure 2:
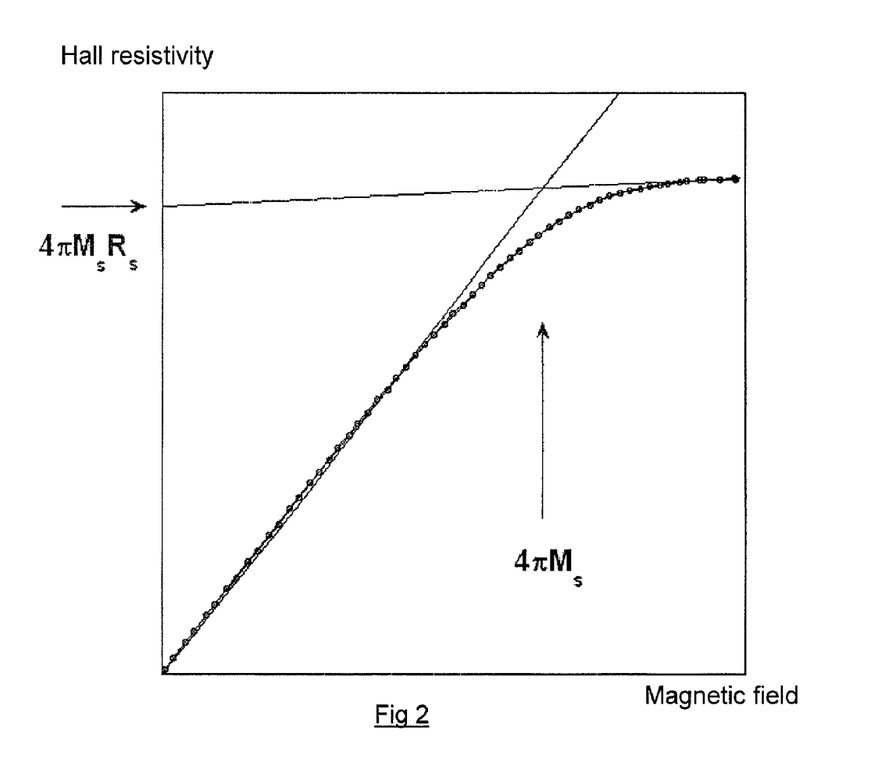
FIG. 2 is a schematic view of the characteristic magnetization curve of a magnetic device according to the prior art.

FIG. 2 schematically shows variation in Hall resistivity as a function of the applied magnetic field. For $H<4\pi M_s$, resistivity varies linearly with the applied field until $\rho_{xy}=4\pi R_sM_s$ is reached. Beyond this point, resistivity varies linearly with the applied field with a slope $R_0$ (first term of equation (1)) which is much smaller, as indicated previously. The useful operating region of a magnetic field sensor based on this principle is therefore confined to magnetic field values less than $4\pi M_s$, where $M_s$ is the saturation magnetization of the magnetic material in question.

It is the slope of the $\sigma_{xy}(H)$ curve that determines the magnetic field sensitivity of such a sensor, expressed in micro-Ohms centimeter per Tesla (μΩcm/T). This slope can also, taking into account the thickness of the thin film and depending on the relation $\rho_{xy}=t\times R_{xy}$, be expressed in Ohms per Tesla (Ω/T). In order to maximize this slope, one can either increase the extraordinary Hall effect term $R_s$ or reduce the planar magnetic anisotropy of the material in order to reduce the perpendicular saturation field.

Two spin-orbit diffusion mechanisms are involved in the extraordinary Hall effect, these are called skew scattering and the side-jump effect.

The extraordinary Hall effect coefficient $R_s$ can consequently be expressed as follows:

$$R_s=a\rho_{xx}+b\rho_{xx}^2 \quad (4)$$

where $\rho_{xx}$ denotes the longitudinal resistivity and a and b are positive constants. The first term of equation (4) corresponds to skew scattering and generally dominates in diluted alloys at low temperature. The second term, linked to the side-jump effect, is greater in alloys with a high concentration of impurities and at high temperature.

One can therefore see that it is useful to choose a material with high longitudinal resistivity and high spin-orbit diffusion in order to maximize $R_s$. Such high longitudinal resistivity is also an advantage because, for small-sized devices, it makes it possible to preserve a sufficient voltage response whilst limiting the current that flows in said device to values that can be withstood, below the value that will cause irreversible structural modifications (electromigration phenomena).

High longitudinal resistivity is obtained either by increasing the atomic disorder of the material (a disordered alloy for example) or by reducing the thickness of the film (it is known that, for an extremely thin film, electrical resistivity varies approximately as 1/t, where t is the thickness of the film). The contribution made by spin-orbit diffusion is augmented by choosing a material that contains elements with a high atomic number, platinum, palladium, gold or metals in the lanthanide series for instance.

It should nevertheless be noted that the incorporation of such materials must necessarily be limited in terms of their concentration in order to preserve the satisfactory magnetic properties of the ferromagnetic alloy.

The second way of increasing the slope of the $\rho_{xy}(H)$ curve is to reduce the planar magnetic anisotropy of the material, i.e. introduce an additional term of opposite sign to the conventional term $4\pi M_s$. The origin of this term denoted by $H_S$ can be volume anisotropy of magnetocrystalline origin, volume anisotropy induced by elastic growth strains or interface anisotropy due to interfacial electronic interactions. The influence of a layer of platinum in contact with a magnetic layer of cobalt, nickel or iron is a typical case, for example.

When this additional term is present, perpendicular anisotropy field $H_K$ can be expressed as follows:

$$H_K = 4\pi M_s - H_S \qquad (5)$$

Qualitatively, perpendicular anisotropy field $H_K$ will therefore progressively decrease as $H_S$ increases, magnetization of the magnetic layer always being parallel to the plane until $H_K$ approaches zero, the limit beyond which, when $H_S$ exceeds $4\pi M_s$, magnetization of the magnetic layer will spontaneously (i.e. without any applied magnetic field) be perpendicular to the plane of the layer. In this latter case, the magnetic material has two stable states in a zero field and can therefore be integrated into devices such as magnetic memories or magnetic logic gates.

Figure 3:
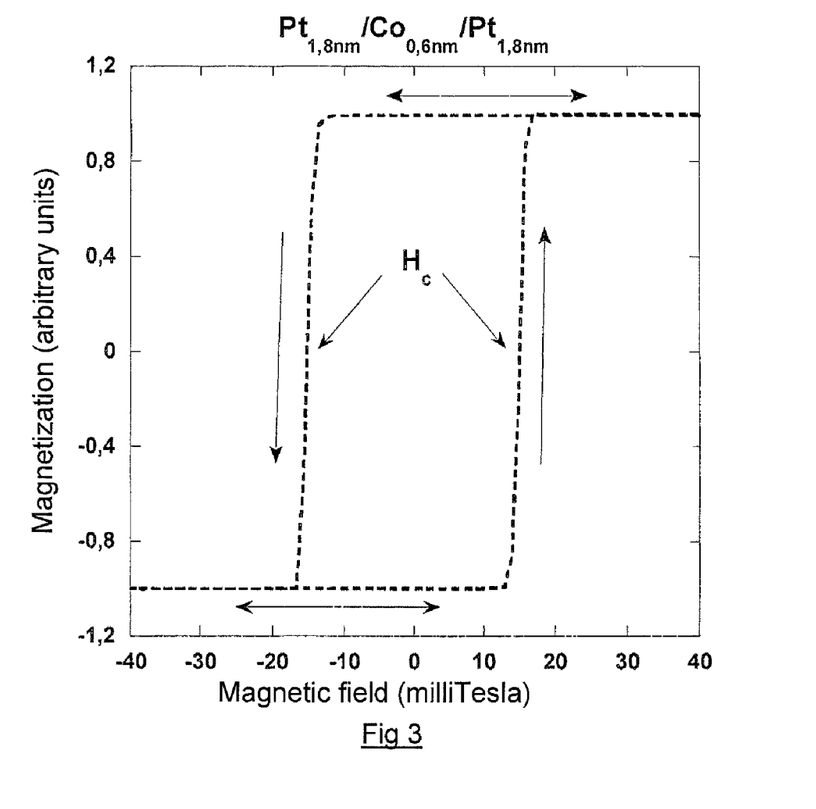
FIG. 3 is a schematic view of the typical variation in magnetization as a function of magnetic field for a material with perpendicular magnetic anisotropy.

FIG. 3 is a schematic view of the magnetization curve obtained in this situation for a typical sample having the following composition: $Pt_{1.8\,nm}/Co_{0.6\,nm}/Pt_{1.8\,nm}$. This curve can be obtained either by traditional magnetometric measurement, by measuring the Hall effect, by measuring the magneto-optical Kerr effect or Faraday effect. The arrows show the direction of travel of the magnetic cycle when excitation field H indicated on the x-axis is applied. The unidirectional arrows represent irreversible cycle changes, whereas the bidirectional arrows represent reversible cycle changes. Magnetization levels are given in arbitrary units on the y-axis.

By gradually reducing the applied magnetic field from a positive value, for example, to a zero value, magnetization of the magnetic layer remains perpendicular to its plane and oriented in the direction of the previously applied magnetic field. It is then necessary to apply a magnetic field of opposite direction having a more or less large amplitude in order to re-orientate magnetization of the layer, still in a direction perpendicular to its plane, but in an opposite direction, namely in the direction of this new applied magnetic field.

The magnetic field required in order to obtain this change, more precisely the magnetic field that must be applied in order for magnetization, averaged over all the magnetic domains, to be zero is referred to as the coercive field and is denoted by $H_c$ in FIG. 3. The value of this coercive field will determine magnetization stability in one direction or the other in the event of exposure to external magnetic disturbances.

The stronger this coercive field, the more stable the material is when exposed to such disturbances. This also, however, makes it more difficult to deliberately modify the magnetization direction, such as, for instance, when the material is used as a magnetic memory in which information is in fact coded by the magnetization direction.

A weak coercive field that requires less energy to change magnetization may therefore be preferable, with the possible need to magnetically "shield" the device against external magnetic disturbances or a strong coercive field may be preferred because it makes the device more stable (but consumes more energy).

It should also be noted that one can use other methods of determining the orientation and amplitude of the magnetization of a magnetic layer.

For example, one can measure the electrical resistance of a trilayer consisting of two independent magnetic layers separated by a non-magnetic metal or by an oxide layer, the magnetization of one of the two magnetic layers being pinned in a predetermined direction. The electrical resistance of such a stack is smaller if both magnetizations are parallel compared with cases where magnetizations are antiparallel (the well-known giant or tunnel magnetoresistance phenomenon).

One can also use magneto-optical effects whereby interaction between incident light and the magnetic moments of the magnetic layer causes the polarization plane of the incident light to rotate and also causes modification of its ellipticity.

The literature contains examples of several materials that may have some of the properties explained above.

Examples include well-known cobalt/platinum multilayer systems that have high perpendicular magnetic anisotropy. Depending on the thicknesses of the elementary platinum and cobalt layers, the number of (Co/Pt) pattern repetitions and the presence of a platinum buffer layer, one can obtain a system having either magnetization that is spontaneously (in a zero magnetic field) perpendicular to the plane of the layers or magnetization in the plane of the layers but with extremely high perpendicular magnetic susceptibility (slope of curve $M_z = f(H)$). Unfortunately, these materials have low longitudinal resistivity due to the low resistivity of their metallic components.

Another example described in a publication by T. W. Kim, S. H. Lim, R. J. Gambino, "*Spontaneous Hall effect in amorphous Tb—Fe and Sm—Fe thin films*", Journal of Applied Physics, 2001, Vol. 89, p. 7212, deals with rare-earth transition-metal (RE-TM) alloys; RE denotes an element in the rare-earth family (lanthanide series) (Gd, Tb, Sm) and TM denotes a magnetic transition element (Fe, Co, Ni or alloys thereof). These materials have a high Hall angle (of the order of 4%), higher longitudinal resistivity than in the previous case but, in contrast, weak magnetic field sensitivity of the order of 0.4 Ω/T.

Alloys of platinum and a magnetic transition metal (Fe, Co, Ni) have greater sensitivity to magnetic fields of the order of 4 Ω/T and longitudinal resistivity of the order of 100 μΩcm (see for example G. X. Miao, Gang Xiao, "*Giant Hall resistance in Pt-based ferromagnetic alloys*", Applied Physics Letters, 2004, Vol. 85, p. 73). One can achieve almost equivalent field sensitivities using alloys of a magnetic material and an oxide, for example $Ni—SiO_2$ (see A. B. Pakhomov, X. Yan, B. Zhao, "*Giant Hall effect in percolating ferromagnetic granular metal-insulator films*", Applied Physics Letters, 1995, Vol. 67, p. 3497). In this case, the advantage is the fact that longitudinal resistivity is extremely high, of the order of $10^5$ to $10^8$ μΩcm, but the Hall angle is small (about 0.1%) and the signal to noise ratio is mediocre.

Finally, extremely high magnetic field sensitivities (300 Ω/T) have been obtained in nickel thin films. Unfortunately, this sensitivity is obtained at low temperature (−100° C.) and diminishes very rapidly before reaching a value of virtually zero at ambient temperature and this restricts the field of application of these materials significantly (see O. Riss, A. Tsukernik, M. Karpovsky, A. Gerber, "*Reorientation phase transition and sensitivity of the extraordinary Hall-effect-based sensors*", Journal of Magnetism and Magnetic Materials, 2006, Vol. 298, p. 73).

The above considerations demonstrate that no currently known magnetic material combines all the necessary properties for use as a magnetic field sensor or magnetic memory, namely high longitudinal resistivity (at least several hundred µΩcm), high Hall resistivity (several percent longitudinal resistivity) and high perpendicular magnetic susceptibility (at least 10 times higher than that of a conventional magnetic material with planar magnetization, i.e. with an out-of-plane saturation field of the order of several dozen milliTeslas), or even perpendicular magnetization in a zero field for magnetic memory or magnetic logic gate type applications. In this respect, the reader is reminded that semiconductor magnetic field sensors currently have magnetic field sensitivities of the order of several 100 Ω/T.

Stacked layers similar to those of the present invention have already been proposed in the literature, but not with a view to applications in magnetic field sensor, magnetic memory or magnetic logic component type devices.

Firstly, one can cite work on multilayers composed of cobalt layers alternating with alumina layers ($Al_2O_3$) (see Ch. Morawe, H. Zabel, "*Structure and thermal stability of sputtered metal/oxide multilayers: the case of Co/$Al_2O_3$*", Journal of Applied Physics, 1995, Vol. 77, p. 1969). In this publication, the authors do not mention any possible perpendicular magnetic anisotropy property of these materials, which the subject of the present invention.

Finally, in contrast to the present invention, the authors do not intend these materials for use in the area of magnetic field sensors or magnetic memories or logic components based, in particular, on measuring the extraordinary Hall effect. In fact, the authors suggest using these materials only because of their structural properties in the context of mirrors for x-rays. This work falls outside the application area referred to by the present invention.

One can also cite work on "discontinuous" multilayers comprising layers of cobalt or cobalt-iron alloys alternating with layers of silicon dioxide $SiO_2$ or alumina $Al_2O_3$ (see B. Dieny, S. Sankar, M. R. McCartney, D. J. Smith, P. Bayle-Guillemaud, A. E. Berkowitz, "*Spin-dependent tunneling in discontinuous metal/insulator multilayers*", Journal of Magnetism and Magnetic Materials, 1998, Vol. 185, p. 283). The authors use the term "discontinuous" to refer to the fact that the layers of Co or CoFe are not in the form of thin films of virtually uniform thickness but rather in the form of Co or CoFe aggregates coated in the oxide matrix. These systems are prepared by cathode sputtering by alternatively depositing layers of magnetic metal and oxide. Co or CoFe atoms tend to coalesce in independent aggregates and this results in a planar structure of more or less discontinuous granules, depending on the thickness of metal deposited, embedded in the insulating matrix.

In these structures, only a "memory" of this thin layer of Co or CoFe is retained and this situation is completely different to that considered in the present invention. No mention is made of any perpendicular magnetic anisotropy properties of these materials in these studies relating to discontinuous metal/insulator multilayers. Finally, the authors do not intend these materials for use in the area of magnetic field sensors or magnetic memories or logic components based, in particular, on measuring the extraordinary Hall effect. This work therefore falls outside the application area referred to by the present invention.

One can also cite work dealing with multilayers fabricated by depositing a cobalt-iron alloy followed by natural oxidation of the surface of this alloy in the presence of oxygen (see G. S. D. Beach, A. E. Berkowitz, "*Co—Fe metal/native-oxide multilayers: a new direction in soft magnetic thin film design I. Quasistatic properties and dynamic response*", IEEE Transactions on Magnetics, 2005, Vol. 41, p 2043, and G. S. D. Beach, A. E. Berkowitz, "*Co—Fe metal/native-oxide multilayers: a new direction in soft magnetic thin film design II. Microscopic characteristics and interactions*", IEEE Transactions on Magnetics, 2005, Vol. 41, p 2053).

These multilayers have high electrical resistivity, a strong magnetic moment and considerable magnetic "softness" (ease with which magnetization can be saturated in a direction parallel to the plane of the layers). The authors do not mention any special property in respect of the amplitude of the extraordinary Hall effect. Although they present results that appear to indicate a tendency for a certain perpendicular anisotropy to occur for thin magnetic metal thicknesses, more detailed scrutiny of their results shows that the observed reduction in the amplitude of perpendicular anisotropy field $H_K$ is essentially due to a decrease in the term $4\pi M_s$ (see equation (5)) rather than to any contribution made by perpendicular anisotropy term $H_S$.

Similarly, the authors predict that magnetization will spontaneously be perpendicular to the plane of the layers for magnetic metal thicknesses less than 1.1 nm, but, at the same time, present results for a thickness of 1.0 nm, i.e. below this limit, which nevertheless unambiguously show that, in this case, magnetization is parallel to the plane of the layers and not perpendicular.

One can finally cite work dealing with stackings consisting of two (Pt/Co) and (Co/Pt) multilayers separated by a NiO oxide layer (see C. Christides and Th. Speliotis, "*Polarity of anomalous Hall effect hysteresis loops in $(Pt/Co)_{15}/AF/(Co/Pt)_{15}$ (AF=FeMn, NiO) multilayers with perpendicular anisotropy*", Journal of Applied Physics, 2005, Vol. 97, p. 013901).

In this work, it appears that the two multilayers on both sides of the NiO layer would have perpendicular magnetization without the NiO layer. This clearly results from the comparison of FIG. 2 (with the NiO layer) and FIG. 3 (without the NiO layer) on page 013901-3 since in both cases the magnetization of the magnetic layers is perpendicular to the plane of the layers. Thus, the perpendicular magnetic anisotropy properties do not result from the presence of the separating oxide layer.

SUMMARY OF THE INVENTION

The present invention proposes a means of producing a magnetic multilayer device having an out-of-plane anisotropy field having a value close to its demagnetizing field, so that the device is extremely sensitive to a magnetic field which can be detected by measuring the extraordinary Hall effect, by measuring magnetoresistance or measuring the Kerr effect or the Faraday magneto-optical effect. The material used makes it possible to combine the advantages of the various materials stated above, namely high perpendicular anisotropy making it possible to compensate or even exceed the inherent shape anisotropy of thin films and, in the particular case where the Hall effect is measured, high longitudinal resistivity and a high extraordinary Hall coefficient.

Thus, the invention relates to a magnetic multilayer device comprising, on a substrate, an alternating sequence of magnetic metal layers M and oxide, hydride or nitride layers O in which the number of M layers equals at least 2 and in which layers M are continuous.

There is, in a temperature range equal to or larger than ambient temperature, interfacial magnetic anisotropy perpendicular to the plane of the layers at the M/O and O/M interfaces, able to orient the magnetization of layers M in a direction perpendicular to the plane of the layers.

The high perpendicular magnetic anisotropy mentioned above is obtained, as in the case of cobalt/platinum multilayers, by strain and electronic hybridization effects at the interfaces between the magnetic layers and the oxide, hydride or nitride layers. As in the (Co/Pt) system, the magnetic layers must be thin (a few nm) in order for these interfacial effects not to become negligible compared to the volume shape magnetic anisotropy which tends to keep magnetization in the plane of the magnetic layer.

High longitudinal resistivity is obtained by using thin magnetic layers that alternate with the oxide, hydride or nitride layers. They are therefore highly resistive due to the important role played by interfacial diffusions. Because all these layers are only repeated a small number of times (typically less than 20 repetitions) in order to obtain the final multilayer structure, the electrical resistance of the entire stack is therefore high.

According to the invention, magnetic metallic layers M have a thickness equal to or less than 5 nm and consist of a magnetic element, or a magnetic alloy or a multilayer formed by an alternating sequence of non-magnetic and magnetic materials, the latter being selected from the group comprising Fe, Ni, Co or alloys thereof.

In addition, oxide, hydride or nitride layers O have a thickness of at least 0.3 nm and are based on elements selected from the group comprising Al, Mg, Ru, Ta, Cr, Zr, Hf, Ti, V, Si, Cu, W, Co, Ni, Fe or alloys thereof and, more generally, any material or alloy capable of forming stable oxides, hydrides or nitrides.

Advantageously, the substrate that receives the above-mentioned stack is made of silicon covered in thermally or naturally oxidized silicon to a depth of 2 to 500 nm.

However, said substrate can also be made of a transparent material such as glass or magnesium oxide for example.

According to one advantageous aspect of the invention, the device comprises a material S that is used as a growth initiator for the first metallic layer M and is selected from the group comprising TiN, CuN, Pt, Ta, Ru, IrMn, PtMn, NiFeCr, oxides and nitrides.

According to another advantageous aspect of the invention, at least one of metallic layers M contains added non-magnetic metals Pd or Pt that are used to modify the perpendicular magnetic anisotropy properties of this layer or elements selected from the group comprising Si, C, B, P, N that are used to modify the electrical resistivity of this layer and/or its magnetization per volume unit.

According to the invention, all layers M are made of the same magnetic material and all layers O are made of the same non-magnetic material. Nevertheless, the chemical composition of at least one of metallic layers M may be different from the others. Similarly, the chemical composition of at least one of layers O may be different from the others.

In addition, all layers O may have the same thickness. However, the thickness of at least one of layers O may be different from the others.

Similarly, the thickness of at least one of metallic layers M may be different from the others.

According to the invention, at least one of layers O may itself consist of a plurality of layers made of oxide, hydride or nitride.

Advantageously:
layer S has a thickness of 0 to 2 nm;
each metallic layer M has a thickness of 0.3 to 5 nm,
each layer O has a thickness of 0.3 to 5 nm,
the number of alternating sequences of layers M and layers O is 1.5 to 20.

The magnetic device according to the invention advantageously has lateral dimensions of less than 1 µm.

The invention also relates to a method for producing the magnetic device in question. This method involves:
depositing, on an electrically insulating surface, a first metallic magnetic layer M by cathode sputtering,
depositing a first layer of metal that constitutes layer O onto this first layer M by cathode sputtering,
oxidizing, hydriding or nitriding this first layer O,
repeating the above three steps or repeating the first of them only,
depositing an electrical contact.

Alternatively, the second and third steps may only consist of a single step, namely direct deposition by radiofrequency sputtering of the O oxide, hydride or nitride layer using a target comprising the corresponding oxide, hydride or nitride.

Advantageously, depositing the first metallic layer M is preceded by a preliminary step consisting of depositing, on the substrate, a layer S made of a growth initiating material. This preliminary step is itself liable to be preceded by depositing a layer of electrically conducting material on the substrate.

Using the method according to the invention, an electrically conducting layer is deposited on the device; this is then cut into a pillar with a square, rectangular, circular or elliptical base having lateral dimensions of several hundred nm or less.

According to the invention, one measures the magnetoresistance of the stack thus produced by passing a current through it perpendicular to the plane of the layers that form it.

According to one variant of the invention, layers O are obtained by natural oxidation, hydriding or nitriding of the metallic layer.

According to another variant of the invention, layers O are obtained by plasma oxidation, hydriding or nitriding of the metallic layer.

According to yet another variant of the invention, layers O are obtained by reactive sputtering in oxygen, hydrogen or nitrogen in the atmosphere inside the deposition chamber.

According to yet another variant of the invention, layers O are obtained by direct deposition of oxide, hydride or nitride by radiofrequency cathode sputtering using a composite metallic oxide, hydride or nitride target material.

According to the invention, certain layers are deposited at a temperature that is different from ambient temperature. For example, the structural quality of some oxide, hydride or nitride layers may be improved if they are grown at high temperature (200° C. for instance). Also, deposition of a layer may also be followed by heat treatment at a temperature higher than said deposition temperature. This may be the case, for example, in order to encourage oxidation or nitriding of a layer or to enable crystallization of an amorphous layer.

In addition, having completed the depositions steps, one may subject the assembly thus obtained to heat treatment for a given period in a rarefied atmosphere or in the presence of a certain gas or mixture of different gases such as oxygen, hydrogen or nitrogen, for example, in order to modify the structure and/or electric transport properties and/or magnetic properties of the device.

The invention relates to a magnetic field sensor consisting of the magnetic multilayer device according to the invention, the latter having a perpendicular anisotropy field that almost counterbalances its demagnetizing field.

The invention also relates to a magnetic memory consisting of the magnetic multilayer device in question in which magnetization of the magnetic layers is perpendicular to the plane of the layers in the absence of any external magnetic field.

The invention also relates to a magnetic logic gate consisting of said magnetic multilayer device in question in which magnetization of the magnetic layers is perpendicular to the plane of the layers in the absence of any external magnetic field.

In order to determine the orientation of the magnetizations of the magnetic layers of the magnetic device which comprises them:

one measures the extraordinary Hall effect by injecting an electric current in a direction that is parallel to the plane of the layers, or one measures the magnetoresistance by injecting an electric current in a direction that is perpendicular to the plane of the layers;

or one measures the magneto-optical Kerr effect or Faraday effect.

BRIEF DESCRIPTION OF THE DRAWINGS

These first three Figures have already been described in reference to the prior state of the art.

DESCRIPTION OF THE PREFERRED EMBODIMENTS

Non-limitatively and merely by way of example, the materials and techniques used in the embodiments described below are as follows:

On a substrate made of silicon, oxidized silicon, glass or magnesium oxide for example, one deposits a first layer of a non-magnetic metal that acts as a buffer layer. This layer improves adhesion and satisfactory growth of the rest of the structure. Although it is not indispensable to the invention, this layer will be used in the descriptions of the preferred embodiments. The various layers are described starting from this first layer made of a non-magnetic material (or failing this, the first layer M) because this corresponds to the sequence in which the layers are successively deposited during fabrication.

Figure 4:
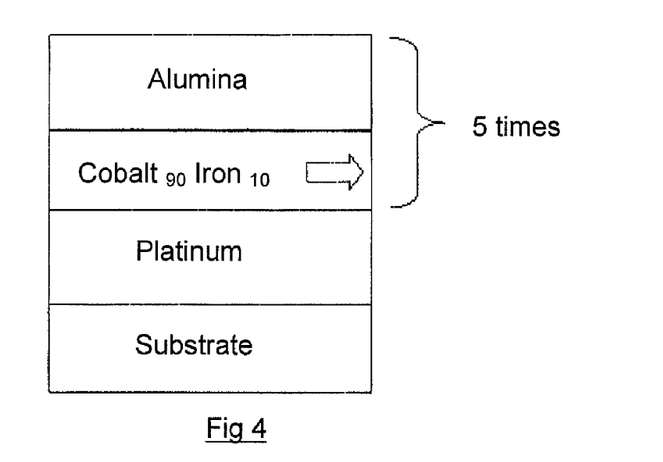
FIG. 4 is a schematic view of a first embodiment of the magnetic device according to the invention.

FIG. 4 is a schematic view of a first embodiment of the invention. In this Figure (and subsequent FIGS. 6, 8, and 11), the direction of the arrows indicates the magnetization direction (in the absence of an applied magnetic field) of the magnetic layers (horizontal arrow for planar magnetization, vertical arrow for perpendicular magnetization).

Immediately after the substrate there is a layer of growth initiating material, such as platinum for example. It can be replaced by another material or by a combination of other materials regarded as suitable for initiating satisfactory growth of thin metallic layers, especially those that result in extremely slight surface roughness. Examples include titanium nitride, copper nitride, ruthenium, tantalum, iridium-manganese alloys, platinum-manganese, nickel-iron-chrome, etc. It is also possible not to use this initial layer if it is established that quality of growth of the magnetic layer on the substrate is satisfactory.

This is followed by the first layer M, which is usually quite thin. If its thickness exceeds a specific value which depends on both the material used for layer M and the strength of the interfacial interactions with the materials in contact with this layer M, magnetization is no longer, as is known, perpendicular to the plane of the layer M due to the volume shape anisotropy of the layer which tends to keep magnetization of the layer in-plane.

For subsequent layers M, their thickness is selected and, above all, determined by the ability to obtain a continuous metallic layer. In fact, as discussed earlier, some magnetic metals do not wet satisfactorily on oxides such as silicon dioxide or alumina. In some cases, the magnetic metal tends to coalesce in the form of more or less discontinuous aggregates, depending on the thickness of the deposited metal.

In other cases, surface tension effects are too weak for this aggregation phenomenon to occur. The metallic layer can then be continuous. The range of thicknesses making it possible to obtain a continuous layer of metal depends on the surface energy of the oxide, the surface energy of the metal, the interfacial energy of the oxide/metal interface and the wettability of the deposition surface due to the metallic filler layer. This possible thickness range in order to obtain continuous metallic layers therefore depends on both metal M and the oxide.

For a given basic material M, one can change the critical thickness of the magnetic layer by adding alloying elements to improve wettability by reducing the surface energy of the metal in favor of the energy of the oxide/metal interface. In one common embodiment, the material is a magnetic alloy $Co_{90}Fe_{10}$ having a thickness of 0.3 to 5 nm, typically 0.6 nm.

In order to adapt the magnetic properties of the device to its intended application (field sensor, memory device or logic gate) and achieve improved performance, especially in terms of perpendicular magnetic anisotropy and growth on the underlying oxide layer, $Co_{90}Fe_{10}$ alloy can be replaced by a $Co_xFe_y$ alloy of different concentration or by a $Co_xNi_yFe_z$ ternary alloy or by a crystallized or amorphous alloy of one or more of these magnetic materials with another non-magnetic element such as boron, silicon, phosphorus and/or carbon. One can also use an alloy or a multilayer comprising a magnetic material and a non-magnetic material.

One can also modify the nature and thickness of the magnetic layers gradually throughout the stacked layers. The chemical composition and thickness of the first magnetic layer need not necessarily be identical to the second layer and the latter, in turn, need not necessarily be identical to the nth layer if a magnetic metal/oxide bilayer is repeated n times. This modification can be used advantageously, depending on the type of property that one wishes to favor, for example good growth of magnetic layers (flatness, texture) or good perpendicular magnetic anisotropy properties.

The first layer M is followed by the first layer O, preferably made of aluminum oxide and having a thickness of the order of 0.3 to 5 nm, this latter figure not being very critical. This layer generally consists of deposited metal such as aluminum that has been oxidized for instance. However, aluminum can be replaced by any other element capable of combining with oxygen to form high-quality oxides in thin layers, namely and for example, magnesium, ruthenium, silicon, tantalum, chrome, zirconium, titanium, hafnium, vanadium, cobalt, nickel, iron, copper, tungsten and, more generally, any material or alloy capable of forming stable oxides.

One can also use an alloy or a multilayer of these materials as an elementary oxide layer for certain particular embodiments. The nature and thickness of the oxide layers may also be modified gradually throughout the stacked layers. For the same reasons as stated above, the chemical composition and thickness of the first oxide layer need not necessarily be identical to those of the second layer and the latter, in turn, need not necessarily be identical to the nth layer if a magnetic metal/oxide bilayer is repeated n times.

This oxide layer may also be used as a substitute for the growth initiating layer (buffer layer) mentioned above.

Instead of using a plasma oxidation technique, it is also possible to produce the oxide by using a known technique of reactive sputtering of the element in question in the presence of a certain quantity of oxygen in the atmosphere inside the deposition chamber, by using a natural oxidation method or by directly depositing the oxide by radiofrequency sputtering of a composite MOx target material where M denotes one of the metals mentioned above and Ox denotes oxygen.

Similar results can be obtained by performing nitriding or hydriding rather than oxidation.

In order to modify the growth qualities of the various layers, it may also be useful to deposit successive layers, or some of them, on a substrate that is maintained at a temperature other than ambient temperature.

The assembly consisting of a layer M and a layer O can be repeated until there are roughly 20 layers O and, optionally, it may comprise a last layer M in order to terminate the multilayer device by a layer M, especially if one intends to use the magnetic device according to the invention for magnetic memory or magnetic logic gate type applications. The pair of M and O layers typically repeats 5 times.

Figure 5:
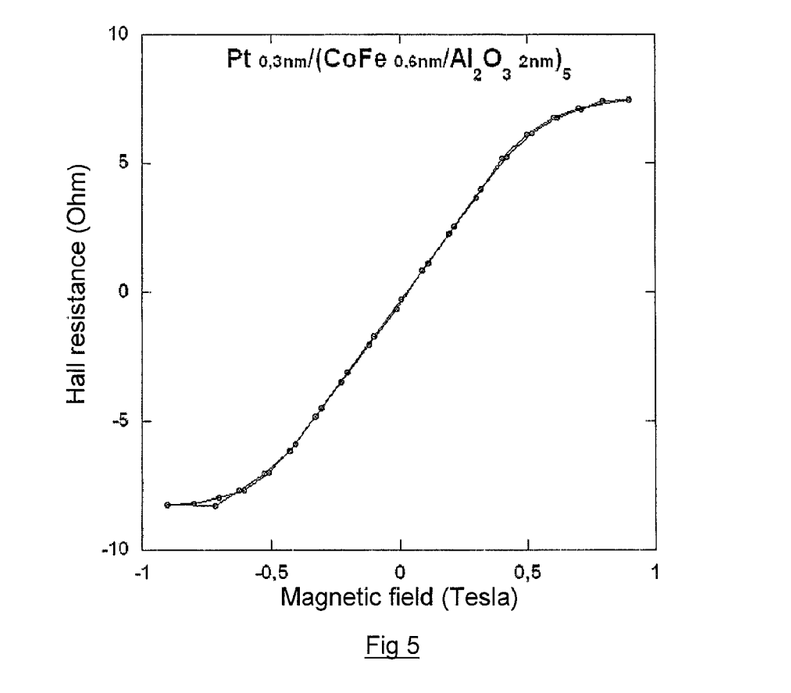
FIG. 5 shows variation in Hall resistance as a function of perpendicular magnetic field for a structure of the Pt 0.3 nm/(CoFe 0.6 nm/$Al_2O_3$ 2.0 nm)$_5$ type.

FIG. 5 shows variation in Hall resistance as a function of magnetic field for a structure of the Pt 0.3 nm/(CoFe 0.6 nm/Al$_2$O$_3$ 2.0 nm)$_5$ type. The magnetic field is applied in a direction perpendicular to the plane of the layers. This structure therefore comprises five repetitions of a bilayer (CoFe/Al$_2$O$_3$) deposited on a platinum growth layer having a thickness of 0.3 nm.

The longitudinal resistivity of this stack is of the order of 1000 μΩcm, i.e. almost two orders of magnitude higher than a similar metallic stack (i.e. one in which the oxide layers have been replaced by platinum layers of equivalent thickness for example). The Hall resistance varies linearly and reversibly over a magnetic field range of +/−0.4 T (Tesla) and the corresponding field sensitivity is of the order of 14 Ω/T.

Figure 6:
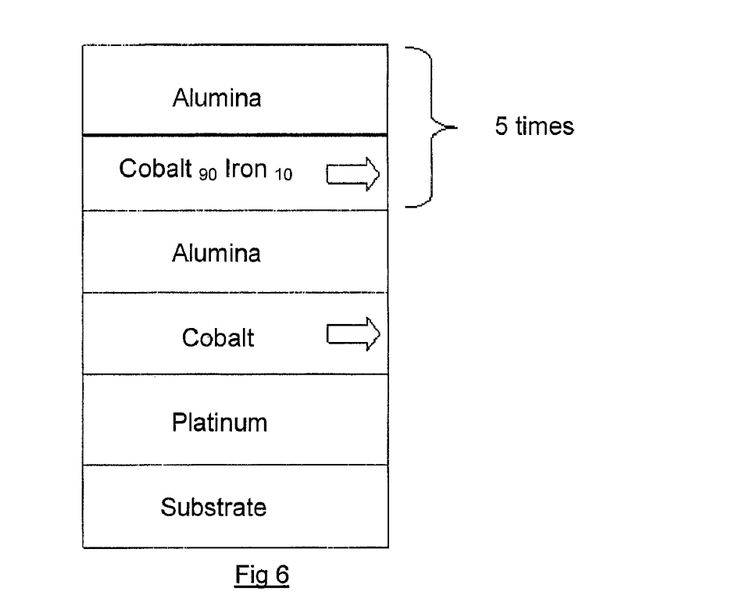
FIG. 6 is a schematic view of a second embodiment of the magnetic device according to the invention.
Figure 7:
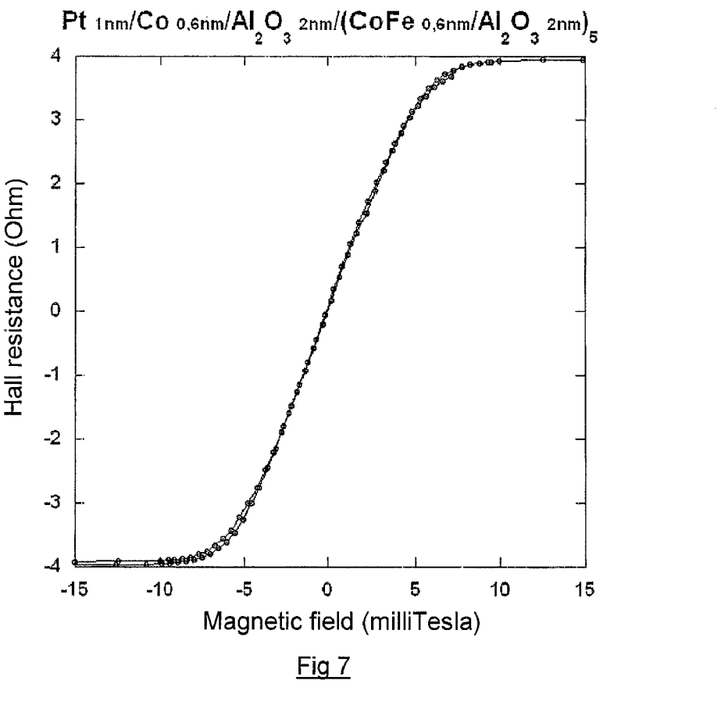
FIG. 7 shows variation in Hall resistance as a function of perpendicular magnetic field for a structure of the Pt 1.0 nm/Co 0.6 nm/$Al_2O_3$ 2.0 nm/(CoFe 0.6 nm/$Al_2O_3$ 2.0 nm)$_5$ type.

FIG. 6 is a schematic view of a second embodiment of the invention. FIG. 7 shows variation in Hall resistance as a function of magnetic field for a structure of the Pt 1.0 nm/Co 0.6 nm/Al$_2$O$_3$ 2.0 nm/(CoFe 0.6 nm/Al$_2$O$_3$ 2.0 nm)$_5$ type, i.e.

a (Co/Al$_2$O$_3$) bilayer deposited on a platinum growth layer having a thickness of 1 nm and topped by five (CoFe/Al$_2$O$_3$) bilayers.

As in the previous case, the longitudinal resistivity of this stack is also of the order of 1000 μΩcm. The Hall resistance is smaller than in the previous case (of the order of 4Ω at saturation rather than 8Ω), firstly because of the larger number of stack repetitions (6 in total rather than 5) and secondly the negative effect of the thicker initial platinum layer (1.0 nm rather than 0.3 nm) which derives a fraction of the current that flows through the structure.

In contrast, this slightly thicker platinum layer significantly enhances perpendicular magnetic anisotropy properties. In fact, the perpendicular anisotropy field is only 6 mT (milliTesla), i.e. 100 times less than in the case of FIG. 5 and 300 times less than the value of the demagnetizing field term 4πM$_s$, where M$_s$ is the magnetization of the Co$_{90}$Fe$_{10}$ alloy.

In this case one obtains a magnetic field sensitivity of the order of 700 Ω/T, i.e. 50 times higher than in the previous case. This value is far in excess of the values mentioned in connection with the prior state of the art as well as those obtained using conventional semiconductor sensors and this makes implementations in accordance with this embodiment especially suitable for use as magnetic field sensors.

The reader should also note that this magnetic field sensitivity can be adjusted as required by modifying the structure of the stack and hence its perpendicular magnetic anisotropy properties. Under special conditions (for example more or less extensive oxidation of the non-magnetic separating layer), the contribution made by perpendicular magnetic anisotropy can become so large that magnetization of the stack is spontaneously (without any applied magnetic field) oriented in a direction perpendicular to the plane of the layers.

Figure 8:
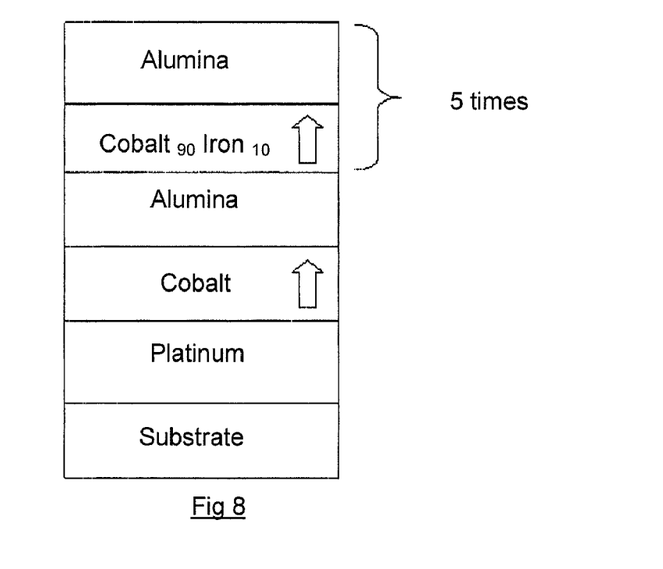
FIG. 8 is a schematic view of a third embodiment of the magnetic device according to the invention.

This case is shown in a third embodiment of the invention which is schematically illustrated in FIG. 8 with a stack identical to that shown in FIG. 6, but for which the oxidation conditions were slightly modified (oxygen pressure slightly reduced during plasma oxidation of aluminum layer), consequently stabilizing the magnetization direction of the layers perpendicular to the plane of said layers, even in the absence of an applied magnetic field. This type of structure is therefore ideally suitable for producing magnetic memories or magnetic logic gates.

Figure 9:
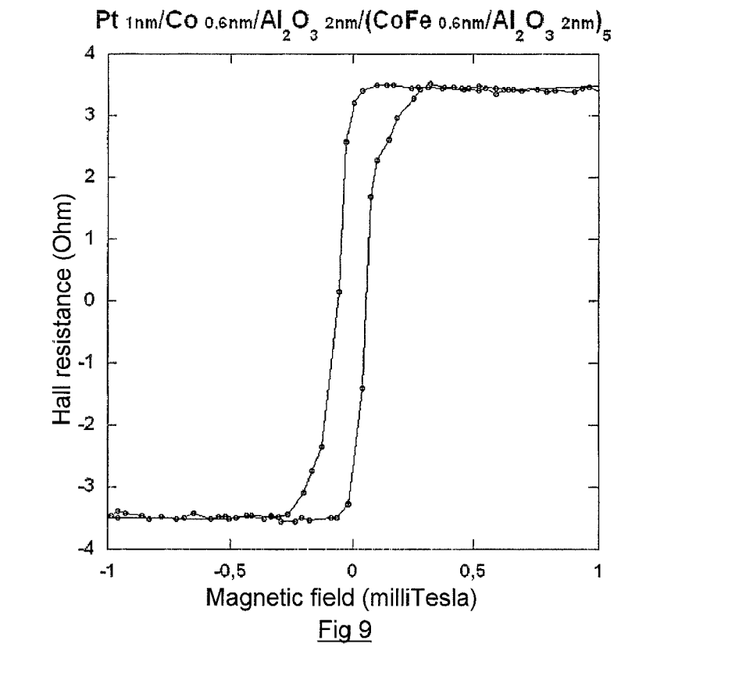
FIG. 9 shows variation in Hall resistance as a function of perpendicular magnetic field for a structure of the Pt 1.0 nm/Co 0.6 nm/$Al_2O_3$ 2.0 nm/(CoFe 0.6 nm/$Al_2O_3$ 2.0 nm)$_5$ type. The oxygen pressure is slightly less than that used in the case of FIG. 7.

As shown in FIG. 9, in this case one obtains two stable states in a zero magnetic field, i.e. a Hall resistance of +/−3.5Ω, depending whether magnetic fields are positive or negative. Hall resistance inversion occurs with extremely weak magnetic fields of the order of 0.3 mT in the present case.

The reader is again reminded that this parameter (coercive field, as defined in relation to FIG. 3) can also be adjusted either by modifying the composition of the stack (layer thicknesses, nature of ferromagnetic material, number of magnetic metal/oxide pattern repetitions) or by using a different oxidation technique or conditions (oxygen pressure, oxidation time, plasma power, etc.) or by carrying out post-deposition heat treatments.

The effect of the latter parameter is illustrated in a fourth embodiment. In this case, the stack shown in FIG. 8, the magnetization curve of which is shown in FIG. 9 prior to any heat treatment, was, after deposition, held at a temperature of 350° C. for 30 minutes in a rarefied 10$^{-6}$ mbar atmosphere, then cooled to ambient temperature before measuring its magnetic properties again.

Figure 10:
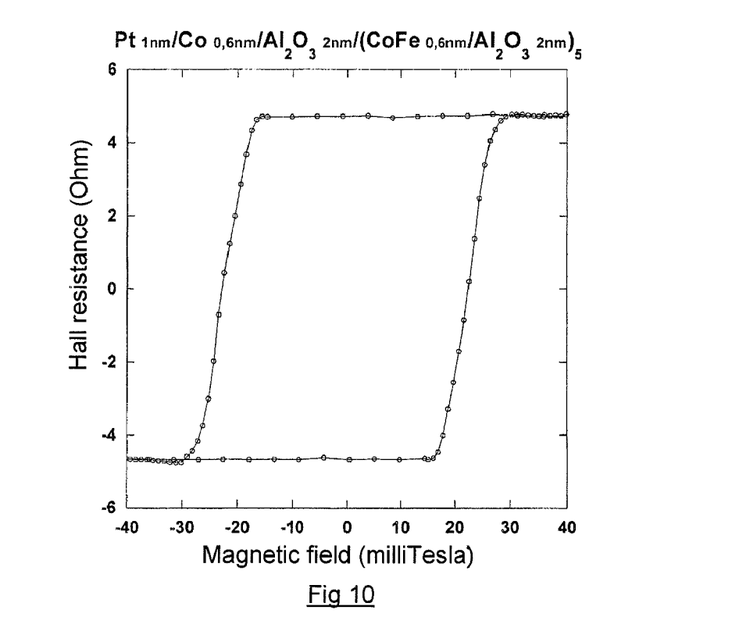
FIG. 10 shows variation in Hall resistance as a function of perpendicular magnetic field for the stack described in relation to FIGS. 8 and 9 after heat treatment for 30 minutes at 350° C.

FIG. 10 shows variation in Hall resistance as a function of the magnetic field applied perpendicular to the plane of the layers. There are two essential differences compared with FIG. 9 which shows measurement of this same property on the stack before it was heat treated.

Firstly, there is a marked increase in the amplitude of the Hall resistance which, after heat treatment, is now $+/-4.7\Omega$, i.e. a 35% increase compared with its initial value. Secondly, the coercive field is significantly modified—it changes from 0.3 mT to 22 mT after heat treatment, i.e. an increase of almost two orders of magnitude.

It is therefore quite possible to modify the magnetic properties of this type of material as required through heat treatment in order to maximize the Hall resistance and adjust magnetization stability with respect to an external magnetic field (i.e. its coercive field) depending on the intended application. These heat treatments also have the advantage of making the device far more structurally stable with respect to any temperature fluctuations.

In this embodiment, the magnetic state of the device can be determined either by measuring the Hall effect or by magneto-optical measurement.

Figure 11:
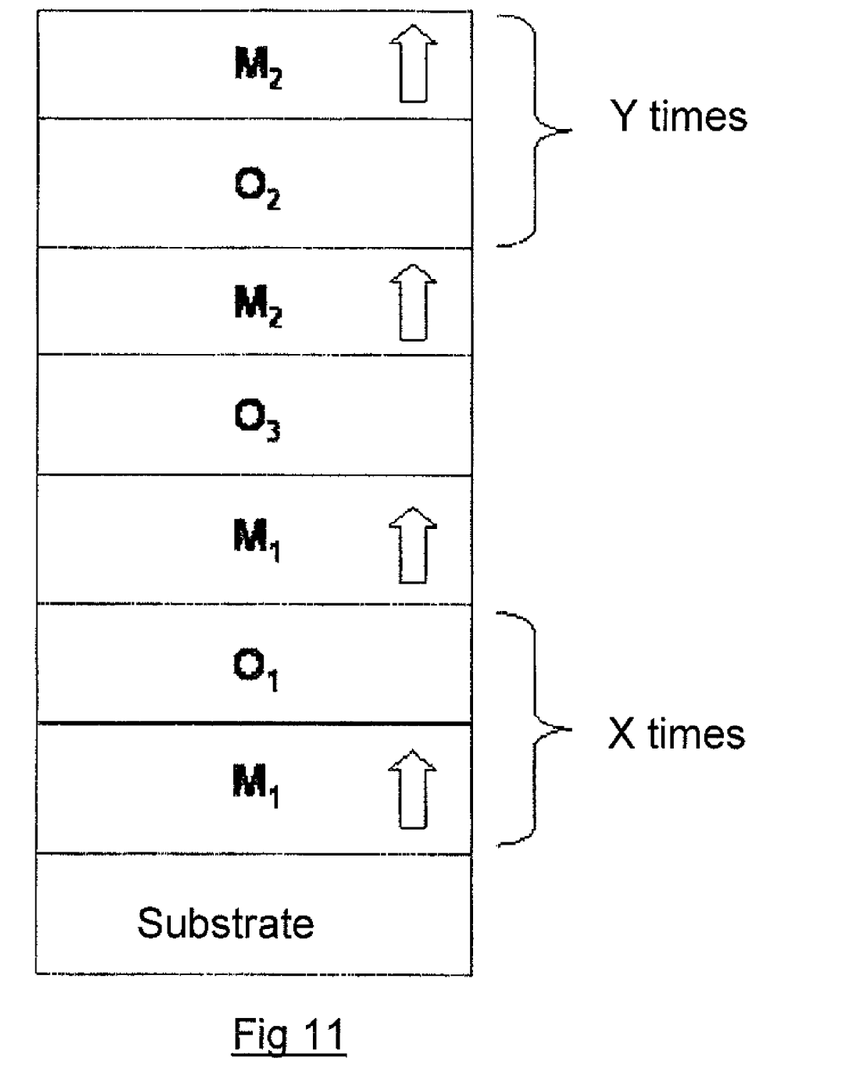
FIG. 11 is a schematic view of a fifth embodiment of the magnetic device according to the invention.

In a fifth embodiment represented schematically in FIG. 11, it is possible to superpose two elementary blocks of the $(M_1/O_1)_x/M_1$ and $M_2/(O_2/M_2)_y$ type separated by a third layer $O_3$, where M denotes a magnetic material and O denotes an oxide, hydride or nitride layer, and where x and y are integers larger or equal to zero.

The composition and thickness of the layers that form each of these two blocks as well as the number of repetitions of the two $(M_1/O_1)$ and $(O_2/M_2)$ elementary patterns, x and y respectively, are selected so that each of the two blocks spontaneously (in a zero magnetic field) has magnetization perpendicular to the plane of the layers. The numbers of repetitions x and y may typically vary from 0 to 20.

If the number, nature and thickness of layers $M_1$, $M_2$, $O_1$ and $O_2$ that constitute each of the two blocks, as well as the thickness and nature of layer $O_3$, are carefully selected, the magnetic hardnesses (coercive fields) of these two blocks can be different. In this case, a particular sequence of applied magnetic fields will make it possible to achieve the four magnetic states of the stack for which the magnetizations of the two blocks are parallel (both up or both down, assuming that the layers are stacked in a horizontal plane) or antiparallel (one up and one down). This description applies more generally to a number of magnetic blocks greater than two.

In this embodiment, each of the four magnetic states corresponds to a different Hall resistance. Measuring the corresponding Hall voltage or magnetization or Kerr or Faraday rotation or ellipticity or magnetoresistance therefore makes it possible to identify the magnetic state of the device. This embodiment is therefore suitable for producing multi-level magnetic recording media type devices.

In a related embodiment, an electric current can flow through the stack thus produced (and cut into a pillar shape with a square, rectangular, circular or elliptical base having lateral dimensions of several hundred nm or less) in a direction perpendicular to the plane of the layers. Due to the well-known phenomenon referred to in the literature as "tunnel magnetoresistance", the parallel and antiparallel orientations of the magnetizations of the two blocks correspond to low and high electrical resistance states respectively. Voltage taps located at the bottom and the top of the stack will make it possible to detect this variation in electrical resistance.

This embodiment is typical of a magnetic tunnel junction structure and is therefore suitable for producing devices such as non-volatile magnetic memories or magnetic logic gates.

For some or all of the embodiments described above, one can put in contact of one or several M layers a supplementary layer made of a material capable of inducing an antiferromagnetic exchange coupling with said M layer, such as for example IrMn, PtMn, FeMn or NiMn alloys.

The invention also relates to a method for fabricating devices in accordance with the above descriptions. This method is defined as follows—this description makes no claim to exhaustively.

The various layers of the stacks described here are deposited by cathode sputtering, at deposition rates of the order of 0.1 nm/s, on silicon substrates covered with 500 nm of thermally oxidized silicon.

The oxide, hydride or nitride layers are produced by firstly depositing the layer of corresponding material, then performing plasma oxidation, hydriding or nitriding of this layer with plasma powers of the order of 10 W at a pressure of $3\times10^{-3}$ mbar of oxygen, hydrogen or nitrogen for several minutes.

Initially one deposits a thin layer of a non magnetic material on the substrate. The purpose of this initial layer is to enable satisfactory growth of subsequent layers. It must be as thin as possible so that it short-circuits as little as possible the current injected into the structure when one wants to measure magnetization of the stack by means of the Hall effect.

One then deposits a layer of magnetic $CO_{90}Fe_{10}$ alloy which is also extremely thin. It is known from the literature that, in the case of cobalt/platinum multilayers for example, optimum perpendicular magnetic anisotropy properties are obtained with magnetic layer thicknesses from 0.3 to 1.0 nm. In the examples described below, this thickness was specified as 0.6 nm. Selecting such a small thickness also makes it possible, as mentioned above, to obtain a considerable increase in the resistivity of the layer compared with that of a thicker layer.

Conversely, reducing this thickness excessively could diminish intrinsic magnetization of this layer or considerably reduce its magnetic ordering temperature. In both cases this would result in reduced effective magnetization of this layer at the operating temperature of the device, namely close to ambient temperature. According to equation (1) this would result in reduced Hall resistivity and therefore a smaller output signal from the device. For other applications as described in the present invention, the thickness of this magnetic layer can be increased up to 5 nm.

Finally, one deposits a layer of aluminum, for example, having a thickness of the order of 0.3 to 5 nm. The stack is then subjected to oxygen plasma, for example, under clearly defined pressure, power and time conditions. This makes it possible to convert the metallic aluminum into aluminum oxide.

It is obvious that, because this alumina layer is electrically insulating, its thickness is far less critical than that of the previous layers. This does not apply, however, if the oxide (or hydride or nitride) of the metal in question is electrically conductive. In the case of an insulating layer, determining its thickness depends both on the growth properties of the layer, the surface roughness of which may increase with thickness, thus having an adverse effect on the growth quality of subsequent layers, and on oxidation mechanisms that may possibly alter depending on the total thickness. The following examples relate to an aluminum thickness of 1.6 nm which is approximately equivalent to 2 nm of alumina once the metallic layer has been oxidized.

This magnetic metal/oxide or magnetic metal/hydride or magnetic metal/nitride bilayer may be repeated a certain number of times. Qualitatively, increasing the number of repetitions makes it possible to reduce the relative contribution made by the growth initiating layer during electric transport measurements (proportionally less current is derived into this layer) but, on the other hand, reduces the perpendicular magnetic anisotropy of the overall stack in a known manner.

In the case of a single repetition, one can also terminate the "active" part of the stack by a second magnetic layer that, if applicable, is different from the first layer in terms of composition and thickness.

Finally, it is possible to carry out heat treatments during or after deposition of the stack. The term "heat treatment" is taken to mean subjecting the prepared material to a temperature that is higher than that at which it was deposited, for a longer or shorter period, in a rarefied atmosphere or in the presence of a certain gas or mixture of different gases such as oxygen, hydrogen or nitrogen, for example.

The purpose of such treatments is to increase the longitudinal resistivity of the stack by possibly disrupting the magnetic layer and/or forming an alloy at its interfaces. These treatments may also modify the chemical or crystallographic structure of the layers and consequently modify the magnetic properties of the stack thus produced.

The invention claimed is:

1. A magnetic multilayer device comprising, on a substrate, an alternating sequence of magnetic metallic layers M and oxide, hydride or nitride layers O, wherein:
the number of layer M equals at least two;
the layers M are continuous, have a thickness ranging between 0.3 and 5 nm, and, in the absence of an applied magnetic field, have their magnetization parallel to the plane of the layer in the absence of layers O because of shape anisotropy;
in a temperature range equal to or larger than ambient temperature, there occurs interfacial magnetic anisotropy perpendicular to the plane of the layers at the M/O and O/M interfaces, able to surpass the shape anisotropy and orient the magnetization axis of layers M in a direction substantially perpendicular to the plane of the layers in the absence of any external magnetic field;
the magnetic metallic layers consist of a magnetic element, a magnetic alloy or a multilayer formed by an alternating sequence of non-magnetic and magnetic materials, the latter being selected from the group consisting of Fe, Ni, Co or alloys thereof; and
the oxide, hydride or nitride layers O have a thickness of at least 0.3 nm and are based on elements selected from the group consisting of Al, Mg, Ru, Ta, Cr, Zr, Hf, Ti, V, Si, Cu, W or alloys thereof.

2. A magnetic multilayer device as claimed in claim 1, wherein the substrate is made of silicon covered by thermally or naturally oxidized silicon to a thickness of 2 to 500 nm.

3. A magnetic multilayer device as claimed in claim 1, wherein the substrate is made of a transparent material.

4. A magnetic multilayer device as claimed in claim 1, wherein it comprises a material S that is used as a growth initiator for the first metallic layer M, this material S being selected from the group comprising TiN, CuN, Pt, Ta, Ru, IrMn, PtMn, NiFeCr, oxides and nitrides.

5. A magnetic multilayer device as claimed in claim 1, wherein at least one of layers M contains added non-magnetic metals Pd or Pt or elements selected from the group comprising Si, C, B, P.

6. A magnetic multilayer device as claim in claim 1, wherein all the layers M are made of the same magnetic material and all the layers O are made of the same non-magnetic material.

7. A magnetic multilayer device as claimed in claim 1, wherein all the layers O have the same thickness.

8. A magnetic multilayer device as claimed in claim 1, wherein the thickness of at least one of layers O is different from the others.

9. A magnetic multilayer device as claimed in claim 4, wherein:
each layer O has a thickness of 0.3 to 5 nm; and
the number of alternating sequences of layers M and layers O is 1.5 to 20, thus constituting a generic structure from M/O/M to $(M/O)_{20}$.

10. A magnetic multilayer device as claimed in claim 7, wherein the chemical composition of at least one of magnetic layers M is different from the others.

11. A magnetic multilayer device as claimed in claim 1, wherein the thickness of at least one of magnetic layers M is different from the others.

12. A magnetic multilayer device as claimed in claim 1, wherein the chemical composition of at least one of layers O is different from the others.

13. A magnetic multilayer device as claimed in claim 1, wherein at least one of layers O itself consists of a plurality of layers made of oxide, hydride or nitride.

14. A magnetic multilayer device as claimed in claim 1, wherein one or several M layers are put in contact of a supplementary layer made of a material capable of inducing an antiferromagnetic exchange coupling with said M layer.

15. A magnetic multilayer device as claimed in claim 1, wherein its lateral dimensions are less than 1 μm.

16. A magnetic multilayer device comprising:
a substrate;
an alternating sequence of magnetic metallic layers M and oxide, hydride or nitride layers O, the number of layer M equals at least two, the layers M are continuous, have a thickness ranging between 0.3 and 5 nm, and are formed of a magnetic material having its magnetization parallel to the plane of the layer in the absence of layers O and any applied magnetic field because of shape anisotropy,
wherein in a temperature range equal to or larger than ambient temperature, there occurs interfacial magnetic anisotropy perpendicular to the plane of the layers at the M/O and O/M interfaces, able to surpass the shape anisotropy and orient the magnetization of layers M in a direction substantially perpendicular to the plane of the layers M in the absence of an external magnetic field,
wherein the magnetic multilayer device exhibits a Hall resistivity associated with a longitudinal resistivity of the order of 1000 μΩcm and has two stable magnetic states in the absence of any applied magnetic field,
wherein the magnetic metallic layers consist of a magnetic element, a magnetic alloy or a multilayer formed by an alternating sequence of non-magnetic and magnetic materials, the latter being selected from the group consisting of Fe, Ni, Co or alloys thereof, and
wherein the oxide, hydride or nitride layers O have a thickness of at least 0.3 nm and are based on elements selected from the group consisting of Al, Mg, Ru, Ta, Cr, Zr, Hf, Ti, V, Si, Cu, W or alloys thereof.

17. The magnetic multilayer device of claim 16, wherein the magnetic multilayer device has a Hall resistance of 8Ω, a field sensitivity of approximately 14 Ω/T and changes state when a perpendicular magnetic field of −0.4 T to +0.4 T is applied.

18. The magnetic multilayer device of claim 16, wherein the magnetic multilayer device has a Hall resistance of 3.5Ω, a field sensitivity of approximately 700 Ω/T and changes state when a perpendicular magnetic field of −6 mT to +6 mT is applied.

19. The magnetic multilayer device of claim 18, wherein subjecting the magnetic multilayer device to a heat treatment in a rarefied atmosphere at a temperature higher than the temperature at which the layers M and O were deposited, increases the Hall resistance of the magnetic multilayer device to 4.7Ω and increases the perpendicular magnetic field to change state of the magnetic multilayer device to −22 mT to +22 mT.

20. The magnetic multilayer device of claim 16, wherein subjecting the magnetic multilayer device to a heat treatment in a rarefied atmosphere at a temperature higher than the temperature at which the layers M and O were deposited, increases the Hall resistance of the magnetic multilayer device by 35% and increases the perpendicular magnetic field to change state of the magnetic multilayer device by more than an order of magnitude.

21. The magnetic multilayer device of claim 16, further comprising a layer of an electrically conducting material that is formed directly on the substrate.

22. The magnetic multilayer device of claim 20, further comprising a layer S of a growth initiating material having a thickness of 2 nm or less that is formed on a layer of electrically conducting material.

* * * * *